US012665577B2

(12) United States Patent
Zhou et al.

(10) Patent No.: US 12,665,577 B2
(45) Date of Patent: Jun. 23, 2026

(54) INPUT MATCHING CIRCUIT AND RELATED APPARATUS

(71) Applicant: Huawei Technologies Co., Ltd., Shenzhen (CN)

(72) Inventors: Quan Zhou, Shanghai (CN); Jinhan Fan, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 47 days.

(21) Appl. No.: 18/611,265

(22) Filed: Mar. 20, 2024

(65) Prior Publication Data

US 2024/0322796 A1 Sep. 26, 2024

(30) Foreign Application Priority Data

Mar. 21, 2023 (CN) .......................... 202310353972.8

(51) Int. Cl.
| | |
|---|---|
| *H03H 11/28* | (2006.01) |
| *H03F 1/56* | (2006.01) |
| *H03F 3/19* | (2006.01) |

(52) U.S. Cl.
CPC ............. *H03H 11/28* (2013.01); *H03F 1/565* (2013.01); *H03F 3/19* (2013.01);
(Continued)

(58) Field of Classification Search
CPC . H03H 11/28; H03F 1/565; H03F 3/19; H03F 2200/222; H03F 2200/294; H03F 2200/451; H03F 2200/241; H03F 1/223; H03F 1/42; H03F 2200/75; H03F 3/195; H03F 1/56; G06F 15/7807
(Continued)

(56) References Cited

U.S. PATENT DOCUMENTS 3,486,126 A * 12/1969 Cadigan .................... H03F 1/32
330/305
7,671,693 B2 3/2010 Brobston et al.
(Continued)

FOREIGN PATENT DOCUMENTS

CN 102299874 A * 12/2011
CN 103746665 A * 4/2014

OTHER PUBLICATIONS

English Translation for CN-102299874-A (Year: 2011).*
English Translation for CN-103746665-A (Year: 2014).*

*Primary Examiner* — Regis J Betsch
*Assistant Examiner* — Amit R Bhatia
(74) *Attorney, Agent, or Firm* — Slater Matsil, LLP

(57) ABSTRACT

An input matching circuit and a related apparatus are provided. The input matching circuit includes an inductive branch, a first resistor, and a field-effect transistor, the inductive branch includes one or more inductors and a second resistor, a first end of the first resistor is connected to a signal input end, and a second end of the first resistor is grounded. The signal input end is configured to provide a signal input for the input matching circuit, an input end of the inductive branch is connected to the signal input end, and an output end of the inductive branch is grounded. An inductance value of an equivalent inductor of the inductive branch between the signal input end and the ground varies with adjustment of a frequency of a signal input by the signal input end.

18 Claims, 6 Drawing Sheets

Input matching circuit

(52) U.S. Cl.
CPC .. *H03F 2200/222* (2013.01); *H03F 2200/294* (2013.01); *H03F 2200/451* (2013.01)

(58) Field of Classification Search
USPC ........................................................ 327/551
See application file for complete search history.

(56) References Cited

U.S. PATENT DOCUMENTS

| | | | |
|---|---|---|---|
| 7,706,759 B2 | 4/2010 | Rofougaran | |
| 8,447,255 B2 | 5/2013 | Asokan | |
| 8,461,931 B1 | 6/2013 | Bayruns et al. | |
| 8,975,981 B2 | 3/2015 | See et al. | |
| 9,054,772 B2 | 6/2015 | Schmidhammer | |
| 9,270,248 B2 | 2/2016 | Bakalski et al. | |
| 9,941,849 B1 * | 4/2018 | Ayranci | H03F 3/195 |
| 10,270,402 B1 * | 4/2019 | Holmes | H03F 3/195 |
| 11,322,843 B2 | 5/2022 | Medhipour et al. | |
| 2013/0063223 A1 | 3/2013 | See et al. | |
| 2017/0026021 A1 | 1/2017 | Cheng et al. | |
| 2019/0140598 A1 | 5/2019 | Schultz et al. | |
| 2019/0165754 A1 | 5/2019 | Zolomy et al. | |
| 2021/0119596 A1 | 4/2021 | Yu et al. | |

* cited by examiner

INPUT MATCHING CIRCUIT AND RELATED APPARATUS

CROSS-REFERENCE TO RELATED APPLICATION

This application claims priority to Chinese Patent Application No. 202310353972.8, filed on Mar. 21, 2023, which is hereby incorporated by reference in its entirety.

TECHNICAL FIELD

This application relates to the field of electronic technologies, and in particular, to an input matching circuit and a related apparatus.

BACKGROUND

With rapid development of communication technologies, increasingly more frequencies, for example, a frequency band (sub 6G) that covers 0.6 GHz to 6 GHz and that is lower than 6 GHz, are applied to communication. This requires a receiver to support as many communication frequency bands as possible. A current mainstream receiving solution of the receiver is to place a low noise amplifier (LNA) and another module (including a front-end drive amplifier, a frequency mixer, a trans-impedance amplifier, an analog-to-digital converter, and the like) of the receiver on different chips. The LNA may amplify a signal received by an antenna, reduce noise interference, and provide a signal for use by another post-stage module. The front-end drive amplifier is connected to an output of the LNA, converts a voltage to a current for processing, outputs a processing result to the frequency mixer, and drives a circuit of another post-stage module of the receiver. If the LNA is a single-ended output rather than a differential output, the front-end drive amplifier may also be designed with a single-ended-to-differential conversion function.

FIG. 1 is a schematic diagram of a structure of a receiver. The receiver may include a plurality of LNAs, a plurality of front-end drive amplifiers, and a frequency mixer. Sub 6G is used as an example. Because there are a plurality of frequency bands that support communication in sub 6G, the receiver may process signals of different frequency bands by using the plurality of LNAs, and then output processing results to the front-end drive amplifier. If a frequency width covered by a single front-end drive amplifier is large enough, and more frequencies are supported, it indicates that the front-end drive amplifier may be connected to more LNAs, in other words, outputs of more LNAs can be processed. Therefore, the receiver needs fewer front-end drive amplifiers to support complete sub 6G, and chip area overheads are lower.

However, a currently designed front-end drive amplifier has a narrow frequency width that meets input matching, in other words, a bandwidth that supports input matching is narrow. Consequently, the front-end drive amplifier supports a small quantity of frequency bands, a plurality of front-end drive amplifiers that cover different frequency bands are required to meet a requirement of using more frequency bands for communication, and chip area overheads are high.

Therefore, how to provide an input matching circuit to enable a front-end drive amplifier to support more frequency bands is an urgent problem to be resolved.

SUMMARY

Embodiments of this application provide an input matching circuit and a related apparatus, to implement input matching in a wider frequency bandwidth, and resolve matching deterioration at a high frequency.

According to a first aspect, an embodiment of this application provides an input matching circuit, including an inductive branch, a first resistor, and a field-effect transistor. The inductive branch includes one or more inductors and a second resistor, a first end of the first resistor is connected to a signal input end, and a second end of the first resistor is grounded. The signal input end is configured to provide a signal input for the input matching circuit, an input end of the inductive branch is connected to the signal input end, and an output end of the inductive branch is grounded. An inductance value of an equivalent inductor of the inductive branch between the signal input end and the ground varies with adjustment of a frequency of a signal input by the signal input end, a gate of the field-effect transistor is connected to the signal input end, a source of the field-effect transistor is grounded, and a drain of the field-effect transistor is for outputting.

This embodiment of this application provides an input matching circuit. The inductance value of the equivalent inductor of the inductive branch, of the input matching circuit, between the signal input end and the ground varies with adjustment of the frequency of the input signal. Therefore, when the frequency of the input signal changes, the equivalent inductor L of the inductive branch between the signal input end and the ground and parasitic capacitance Cgs of the field-effect transistor can reach LC parallel resonance, to ensure that impedance of an LC parallel circuit at the frequency of the input signal is infinite. In addition, the LC parallel circuit is connected to a resistor, and a resistance value of the resistor can be designed to ensure that impedance of the input matching circuit is close to matched impedance. Therefore, the input matching circuit provided in this application can implement input matching in a wider frequency bandwidth, that is, can implement impedance matching in different frequency bands. In this way, it can be ensured that a front-end drive amplifier that uses the input matching circuit has a wider frequency width that meets input matching, and the front-end drive amplifier can support more communication frequency bands. In addition, in a conventional input matching circuit, circuit impedance is capacitive when a frequency increases, which causes matching deterioration at a high frequency. The input matching circuit in this application is different from the conventional input matching circuit, and the impedance of the input matching circuit in a current operating frequency band is always close to pure real-number impedance, to resolve matching deterioration at a high frequency. In addition, the equivalent inductor between the signal input end and the ground is adjustable, to avoid a large difference between matched bandwidths of different chips caused by deviation of an inductance value from a designed target value due to chip processing deviation.

In a possible implementation, a higher frequency of the signal input by the signal input end indicates a lower inductance value of the equivalent inductor of the inductive branch between the signal input end and the ground.

In this embodiment of this application, because imaginary-part impedance of the parasitic capacitance Cgs connected in parallel to the inductive branch decreases as the frequency increases, when the frequency of the signal input by the signal input end increases, the inductance value of the inductive branch decreases. This can ensure that the LC parallel circuit including the inductive branch and Cgs is in an LC resonant state in the current operating frequency band.

In a possible implementation, the inductive branch includes a first inductor and the second resistor, the first inductor and the second resistor are connected in series between the signal input end and a ground point, and the second resistor is a variable resistor.

In this embodiment of this application, the inductive branch may be implemented by connecting one inductor and one resistor in series, and the resistor is a variable resistor. When a resistance value of the resistor changes, the inductance value of the equivalent inductor of the inductive branch between the signal input end and the ground changes accordingly. This can ensure that resonance between the inductive branch and the parasitic capacitance Cgs of the field-effect transistor in the current frequency band can also be implemented when the frequency of the input signal changes.

In a possible implementation, the inductive branch includes a second inductor, a third inductor, and a third resistor, the second inductor and the third inductor are connected in series between the signal input end and a ground point, and the second inductor and the third resistor are connected in parallel.

In this embodiment of this application, the inductive branch may be implemented by a series-parallel network of two inductors and one resistor. For the series-parallel network, when the frequency of the input signal is low, a signal is usually transmitted in an inductor (namely, the second inductor) with low impedance instead of a resistor (namely, the third resistor). The inductance value of the inductive branch may be simply understood as inductance values of the second inductor and the third inductor. When the frequency of the input signal is high, a signal is usually transmitted in a resistor (namely, the third resistor) with low impedance instead of an inductor (namely, the second inductor, because impedance of an inductor is proportional to a frequency) with high impedance. The inductance value of the inductive branch may be simply understood as an inductance value of the third inductor. Therefore, the inductive branch implements an inductor whose inductance decreases as a frequency increases, so that the inductive branch can resonate with the capacitor Cgs at a low frequency and a high frequency. In addition, the LC parallel circuit and the first resistor are connected in parallel, so that the impedance of the input matching circuit can be close to the matched impedance. Therefore, a matching network can meet an impedance matching requirement in a wider frequency bandwidth, that is, the input matching circuit can implement input matching in a wider frequency bandwidth.

In a possible implementation, the first resistor is a variable resistor.

In this embodiment of this application, in a case in which the inductive branch includes the first inductor and the second resistor, if the resistor (namely, the first resistor) that is connected in parallel to the inductive branch is also a variable resistor, when the resistance value of the resistor in the inductive branch changes, only whether a requirement of a resonant condition is met needs to be considered. Then, impedance matching between internal resistance of a signal source and the impedance of the input matching circuit may be ensured by changing a resistance value of the first resistor, to avoid a case in which resonance and impedance matching cannot be balanced when only the second resistor can be adjusted. In a case in which the inductive branch includes the second inductor, the third inductor, and the third resistor, the value of the first resistor is adjusted to ensure that equivalent real-part impedance can meet an impedance matching requirement.

According to a second aspect, an embodiment of this application provides a front-end drive amplifier, including a plurality of input matching circuits in any implementation of the first aspect.

According to a third aspect, an embodiment of this application provides a semiconductor chip, including a plurality of input matching circuits in any implementation of the first aspect.

According to a fourth aspect, an embodiment of this application provides an electronic device. The electronic device may include the input matching circuit in any implementation of the first aspect, the front-end drive amplifier in the second aspect, or the semiconductor chip in the third aspect. The electronic device further includes a primary processor, and the primary processor is coupled to the input matching circuit, the front-end drive amplifier, or the semiconductor chip. The electronic device further includes a memory, and the memory is configured to store program instructions and data that are necessary for running of the input matching circuit, the front-end drive amplifier, or the semiconductor chip, and the primary processor. The electronic device may further include a communication interface used by the electronic device to communicate with another device or communication network.

According to a fifth aspect, an embodiment of this application provides a receiver. The receiver may include the input matching circuit in any implementation of the first aspect, the front-end drive amplifier in the second aspect, or the semiconductor chip in the third aspect.

According to a sixth aspect, this application provides a chip system. The chip system may include the input matching circuit in any implementation of the first aspect, the front-end drive amplifier in the second aspect, or the semiconductor chip in the third aspect. In a possible design, the chip system further includes a processor and a memory. The memory is configured to store program instructions and data that are necessary for or related to running of the input matching circuit, the front-end drive amplifier, the semiconductor chip, and the processor. The chip system may include a chip, or may include a chip and another discrete component.

According to a seventh aspect, this application provides a system on a system-on-a-chip (SoC). The SoC may include the input matching circuit in any implementation of the first aspect, the front-end drive amplifier in the second aspect, or the semiconductor chip in the third aspect, and a processor, an internal memory, and an external memory that are coupled to the input matching circuit, the front-end drive amplifier, or the semiconductor chip. The internal memory and the external memory are configured to store program instructions and data that are necessary for or related to running of the input matching circuit, the front-end drive amplifier, or the semiconductor chip, and the processor. The SoC may include a chip, or may include a chip and another discrete component.

BRIEF DESCRIPTION OF DRAWINGS

To describe technical solutions in embodiments of this application or in the background more clearly, the following briefly describes the accompanying drawings for describing embodiments of this application or the background. It is clear that the accompanying drawings in the following descriptions merely show some embodiments of this application, and persons of ordinary skill in the art can derive other drawings from the accompanying drawings without creative efforts.

DESCRIPTION OF EMBODIMENTS

Figure 1:
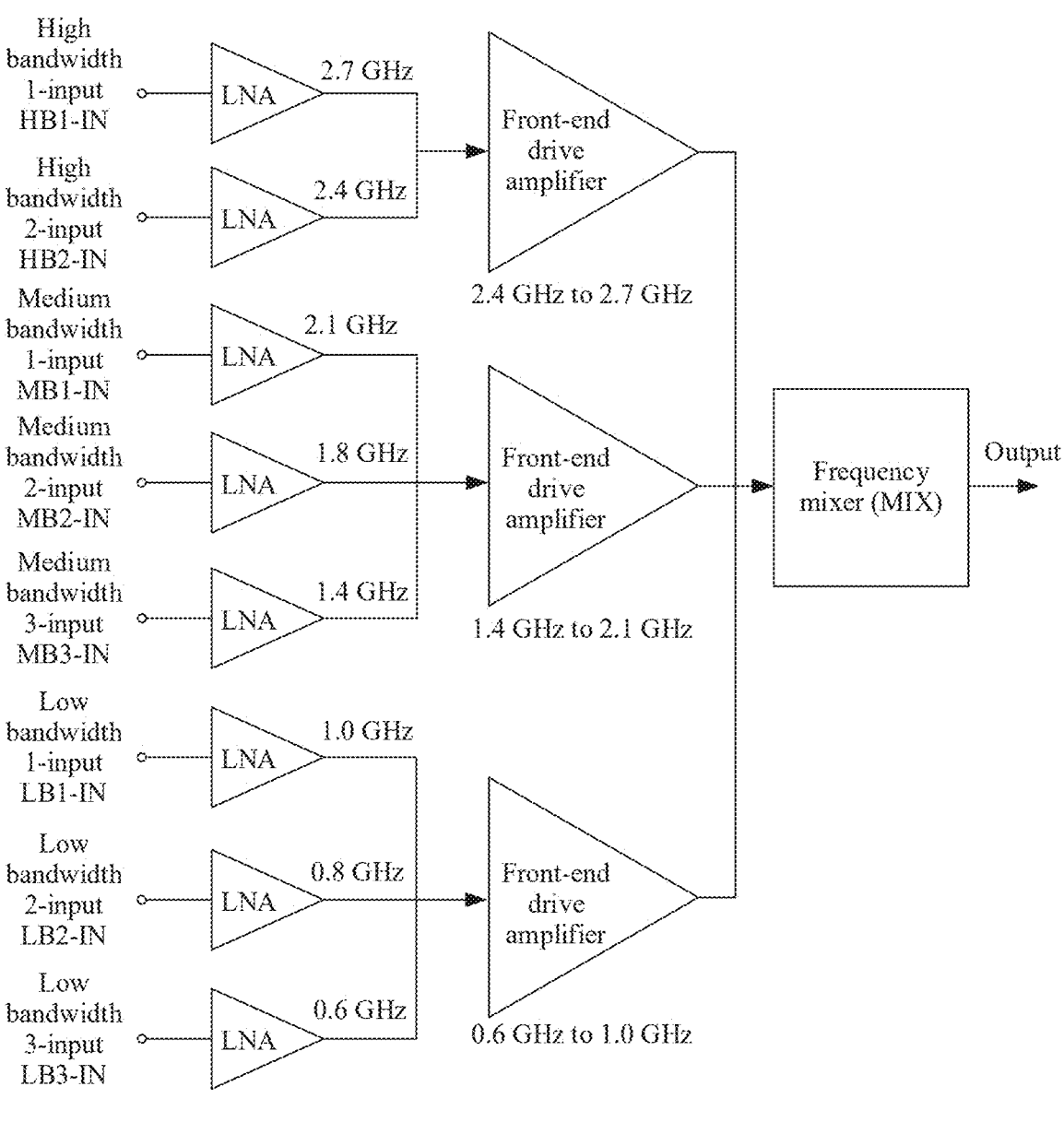
FIG. 1 is a schematic diagram of a structure of a receiver.

The following describes embodiments of this application with reference to the accompanying drawings in embodiments of this application.

In the specification, claims, and the accompanying drawings of this application, terms such as "first", "second", "third", and "fourth" are intended to distinguish between different objects but do not describe a particular order. In addition, the terms "including" and "having" and any other variants thereof are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

An "embodiment" mentioned in this specification means that a particular characteristic, structure, or feature described with reference to embodiments may be included in one or more embodiments of this application. The phrase shown in various locations in the specification may not necessarily refer to a same embodiment, and is not an independent or optional embodiment exclusive from another embodiment. It is explicitly and implicitly understood by persons skilled in the art that embodiments described in the specification may be combined with another embodiment.

Some terms in this application are first described, to help persons skilled in the art have a better understanding.

(1) Impedance matching: The impedance matching is used to transmit a signal to a load point, to achieve an object in which almost no signal is reflected back to a source point, so as to improve energy efficiency. When internal resistance of the signal source is equal to characteristic impedance of a transmission line connected to the signal source, and a phase of the signal source is the same as a phase of the transmission line, an input end of the transmission line is in an impedance matching state, which is referred to as input matching for short. When the characteristic impedance of the transmission line is equal to characteristic impedance of the connected load, and the phase of the transmission line is the same as a phase of the load, an output end of the transmission line is in the impedance matching state, which is referred to as output matching for short. In embodiments of this application, an input matching circuit is provided, so that a front-end drive amplifier has a wider frequency width that meets input matching, and the front-end drive amplifier can support more communication frequency bands. This can resolve input matching deterioration as a signal frequency increases, and reduce a difference between frequency widths, that meet input matching, of different front-end amplifiers.

(2) Impedance: In a circuit with a resistor, an inductor, and a capacitor, opposition effect imposed by the circuit on an alternating current is referred to as impedance, which is usually represented by Z. The impedance may include one or more of resistance, inductive reactance, and capacitive reactance.

(3) Inductive reactance: A feature of the inductor is keeping direct current flowing and opposing an alternating current. When the alternating current passes the inductor, self-inductive electromotive force is generated in the inductor, and opposes a current change. Opposition imposed by the inductor on a current is referred to as inductive reactance. The inductive reactance is usually represented by a symbol $X1$, and a value is $2\pi fL$, where f is a frequency of an alternating current, and L is an inductance value of the inductor. A wider frequency or a larger inductance value indicates larger inductive reactance. The inductance value is an inherent parameter of an inductive element. The inductance value is constant regardless of a frequency of a circuit. Impedance of an inductive element on alternating currents of different frequencies is different. In a resonant circuit, the inductance value and another parameter of a resistance-capacitance element can determine a resonant frequency.

(4) Capacitive reactance: A feature of a capacitor is insulating a direct current and opposing an alternating current. Opposition imposed by the capacitor on the alternating current is referred to as capacitive reactance. The capacitive reactance is usually represented by a symbol $Xc$, and a value is $\frac{1}{2\pi fC}$, where f is a frequency of an alternating current, and C is a capacitance value. A larger frequency indicates smaller capacitive reactance.

(5) LC resonant circuit: The LC resonant circuit may be classified into an LC series resonant circuit and an LC parallel resonant circuit. When the LC series resonant circuit works at a resonant frequency $f0$, an inductive reactance and a capacitive reactance counteract each other, the circuit present a short-circuit feature externally, and a current in the circuit is maximum. When the LC parallel resonant circuit works at the resonant frequency $f0$, the inductive reactance is equal to the capacitive reactance, and reactive branches have equal currents and opposite directions. Therefore, the currents counteract each other, a current in the circuit is minimum, and total impedance is maximum. In embodiments of this application, an inductance value of an inductive branch in the input matching circuit may be adjusted based on a frequency of an input signal, so that an inductor L of the inductive branch and parasitic capacitance $Cgs$ of a field-effect transistor can reach LC parallel resonance, to implement a resonant frequency adjustment function. This further improves impedance matching effect, and resolves matching deterioration at a high frequency.

(6) "A plurality of": "A plurality of" means two or more than two. The term "and/or" describes an association relationship for describing associated objects and represents that three relationships may exist. For example, "A and/or B" may represent the following three cases: Only A exists, both A and B exist, and only B exists. The character "/" generally indicates an "or" relationship between the associated objects.

First, a technical problem to be specifically resolved in this application is analyzed and proposed. Currently, an implementation solution of the front-end drive amplifier includes the following solution 1 and solution 2.

Solution 1: Input Matching of the Front-End Drive Amplifier is Implemented by a Ground Resistor.

Figure 2A:
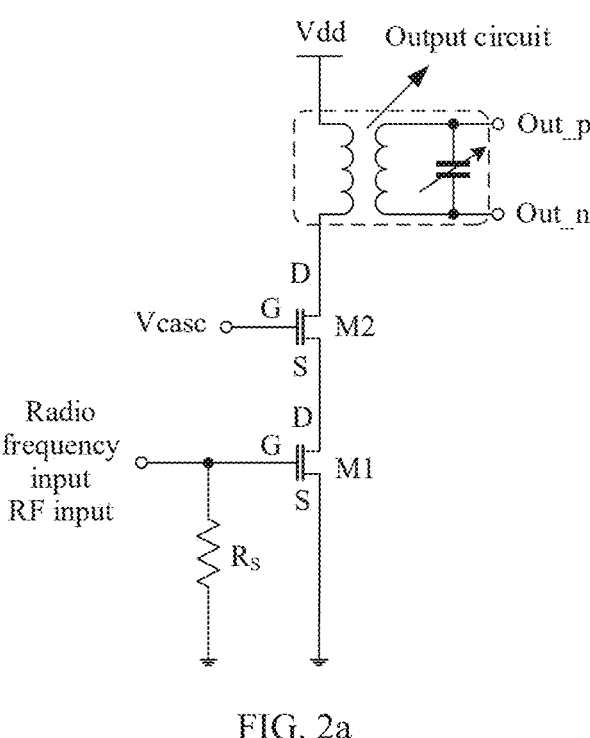
FIG. 2a is a schematic diagram of a circuit structure of a front-end drive amplifier in the conventional technology.

FIG. 2a is a schematic diagram of a circuit structure of a front-end drive amplifier in the conventional technology. The front-end drive amplifier includes a resistor, one or more metal-oxide-semiconductor field-effect transistors (metal-oxide-semiconductor, MOS transistor), and an output circuit. One end of the resistor ($R_S$) and a gate G of a MOS transistor (for example, M1) are connected in parallel to a radio frequency input (RF input) end, and the other end of the resistor is grounded. A source S of the M1 transistor is grounded, and a drain D of the M1 transistor is connected to a source of another MOS transistor (for example, M2). A drain of M2 is connected to an output circuit, and M1 and M2 form a cascode structure (cascode structure).

Solution 2: Input Matching of the Front-End Drive Amplifier is Implemented by Transconductance (Gm) of a Plurality of MOS Transistors.

Figure 2B:
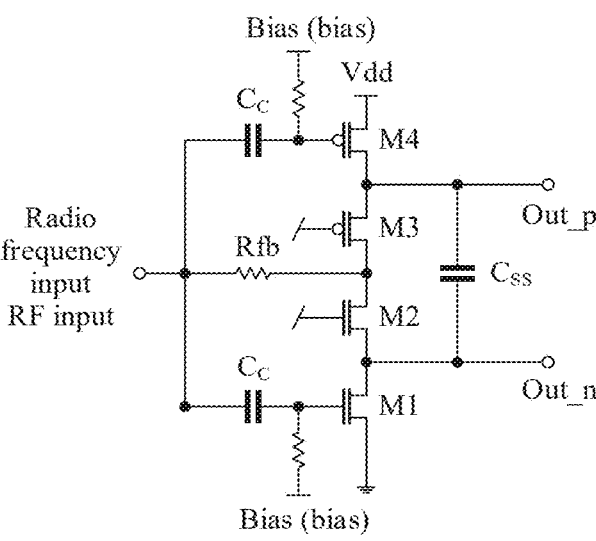
FIG. 2b is a schematic diagram of a circuit structure of another front-end drive amplifier according to the conventional technology.

FIG. 2b is a schematic diagram of a circuit structure of another front-end drive amplifier in the conventional technology. The front-end drive amplifier includes a resistor, a plurality of MOS transistors (for example, M1 to M4), and a plurality of capacitors (for example, $C_C$ and $C_{SS}$). Gates of M1 and M4 are biased (bias), where M1 and M2 are N-type MOS transistors, and M3 and M4 are P-type MOS transistors.

The solution 1 and the solution 2 may have the following disadvantages: a frequency width that meets input matching is narrow, matching deterioration at a high frequency, a large difference between frequency widths, of different chips, that meet input matching, and the like.

For the structure of the solution 1, impedance matching is performed by using pure resistance in the structure. However, because the MOS transistor has parasitic gate capacitance (Cgs), impedance actually used for impedance matching in the structure is parallel impedance of the resistance and the MOS transistor Cgs.

For the structure of the solution 2, impedance matching is performed by using active inductance formed by the plurality of MOS transistors and transconductance (gm) of the plurality of MOS transistors. Similarly, because the parasitic Cgs of the MOS transistors cannot be canceled, characteristic impedance of the structure is also actually related to Cgs.

When frequencies input by signal sources in the solution 1 and the solution 2 change (internal resistance of the signal sources remains unchanged), capacitive reactance of Cgs varies with the frequencies. In this case, characteristic impedance of the two circuit structures in the solution 1 and the solution 2 also varies with the capacitive reactance of Cgs. When a frequency change exceeds a specific range, the foregoing two circuit structures may no longer meet an input matching condition, in other words, a frequency width that meets input matching is narrow. In addition, because the capacitive reactance is inversely proportional to the frequency, when the frequency increases, the capacitive reactance of the capacitor decreases. Consequently, when the frequency is high, impedance of the two circuit structures is low, matching deterioration is caused, additional costs need for performance, and a gain is reduced. In addition, for front-end drive amplifiers designed for the two circuit structures, a difference between input matching bandwidths may be large during manufacturing. For example, the front-end drive amplifier needs to cover a frequency bandwidth from 0.6 GHz to 2.7 GHz, the internal resistance of the signal source is 50 ohms, and characteristic impedance of the front-end drive amplifier also needs to be 50 ohms. However, due to an error in a manufacturing process, the characteristic impedance is not processed to 50 ohms, for example, the processed characteristic impedance is 45 ohms (or of another value). Consequently, when the frequency changes, a frequency bandwidth covered by the front-end drive amplifier may be 0.6 GHz to 2.1 GHz, or another bandwidth, and the difference is large, which affects an actual application range of the front-end drive amplifier, or even causes a chip waste.

Therefore, this application provides an input matching circuit, to resolve some or all of the foregoing problems in the conventional technology. In the input matching circuit provided in this application, an inductance value of an equivalent inductor of an inductive branch, of the input matching circuit, between a signal input end and the ground varies with adjustment of a frequency of an input signal. Therefore, when the frequency of the input signal changes, the equivalent inductor L of the inductive branch between the signal input end and the ground and parasitic capacitance Cgs of a field-effect transistor can reach LC parallel resonance at the current frequency of the input signal, to ensure that impedance of an LC parallel circuit at the frequency of the input signal is infinite. In addition, the LC parallel circuit is connected to a resistor, and a resistance value of a resistor can be designed to ensure that impedance of the input matching circuit is close to matched impedance. Therefore, the input matching circuit provided in this application can implement input matching in a wider frequency bandwidth, that is, can implement impedance matching in different frequency bands. In this way, it is ensured that a front-end drive amplifier that uses the input matching circuit has a wider frequency width (namely, bandwidth) that meets input matching, and the front-end drive amplifier can support more communication frequency bands. In addition, in a conventional input matching circuit, impedance is capacitive when a frequency increases, which causes matching deterioration at a high frequency. The input matching circuit in this application is different from the conventional input matching circuit, and the impedance of the input matching circuit in a current operating frequency band is always close to pure real-number impedance, to resolve matching deterioration at a high frequency. In addition, the equivalent inductor between the signal input end and the ground is adjustable, to avoid a large difference between matched bandwidths of different chips caused by deviation of an inductance value from a designed target value due to chip processing deviation.

The following first describes an example of a scenario in which the input matching circuit (and the front-end drive amplifier based on the circuit) provided in this application can be used.

Figure 3:
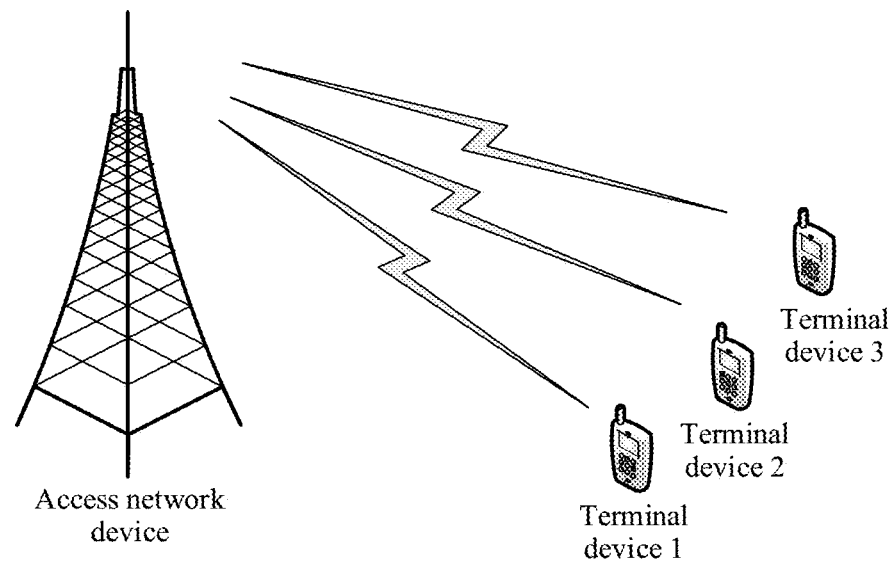
FIG. 3 is a schematic diagram of an application scenario of an input matching circuit according to an embodiment of this application.

FIG. 3 is a schematic diagram of an application scenario of an input matching circuit according to an embodiment of this application. A scenario architecture in which the input matching circuit provided in embodiments of this application may be used may include one or more terminal devices and one or more access network devices. The access network device includes the input matching circuit provided in embodiments of this application, and may receive signals radiated by the one or more terminal devices, to perform data exchange. The terminal device may also include the input matching circuit provided in embodiments of this application, and may receive signals radiated by the one or more access network devices, to perform data exchange.

The access network device may be an apparatus deployed in a radio access network for providing a wireless communication function for the terminal device. The access network device may include various forms of macro base stations, micro base stations (also referred to as small cells), relay stations, access points, and the like. In systems using different radio access technologies, names of access network devices may be different, for example, a base transceiver station (BTS) in a global system for mobile communication (GSM) or a code division multiple access (CDMA) network, an NB (NodeB) in wideband code division multiple access (WCDMA), and an eNB or eNodeB (Evolved NodeB) in long term evolution (LTE). The access network device may alternatively be a wireless controller in a cloud radio access network (CRAN) scenario. The access network device may alternatively be a base station device in a 5G network or an access network device in a future evolved public land mobile network (PLMN). The access network device may alternatively be a wearable device or a vehicle-mounted device. In a communication scenario, the access network device may also include a sending unit, to enable the access network device to send signals at various frequencies to the terminal device, so as to send data.

The terminal devices may be various handheld devices, vehicle-mounted devices, wearable devices, computing devices, or other processing devices connected to a wireless modem that have a wireless communication function. For example, the terminal device may be a mobile station (MS), a subscriber unit, a cellular phone, a smartphone, a wireless data card, a personal digital assistant (PDA) computer, a tablet computer, a wireless modem, a handheld device (Handset), a laptop computer, a machine type communication (MTC) terminal, or the like. In the communication scenario, the terminal device may include a sending unit, to enable the terminal device to send signals at various frequencies to the access network device, so as to send data.

It should be noted that embodiments of this application may be applied to various communication systems, provided that an entity in the communication system needs to send information by using a signal, and another entity needs to receive the information. It may be understood that the communication system architecture or the scenario in the foregoing figure is merely an example implementation in embodiments of this application. The communication system architecture or the scenario in embodiments of this application includes but is not limited to the foregoing communication system architecture or scenario. In addition, the input matching circuit provided in embodiments of this application may also be used in another scenario, for example, scenarios such as biomedicine, radar imaging, engineering measurement, high-speed communication, or a through-the-wall radar. This is not specifically limited herein.

Then, to better understand the input matching circuit provided in embodiments of this application, the following describes a structure of the input matching circuit provided in embodiments of this application as an example. It may be understood that the structure of the input matching circuit described in embodiments of this application is intended to describe the technical solutions in embodiments of this application more clearly, and does not constitute any limitation on the technical solutions provided in embodiments of this application.

Figure 4A:
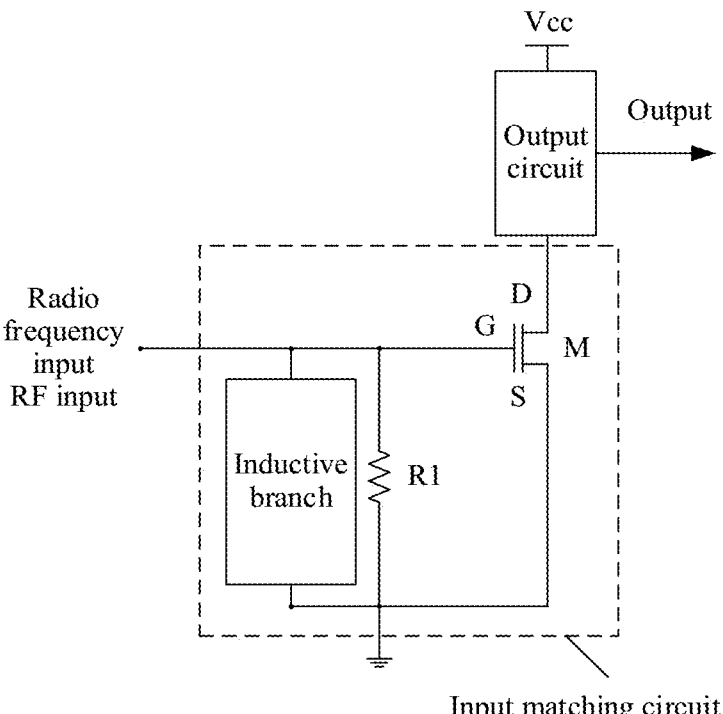
FIG. 4a is a schematic diagram of a structure of an input matching circuit according to an embodiment of this application.

FIG. 4*a* is a schematic diagram of a structure of an input matching circuit according to an embodiment of this application. The input matching circuit may include one inductive branch, one resistor (namely, a first resistor, corresponding to R1 in FIG. 4*a*), and one field-effect transistor (corresponding to M in FIG. 4*a*). The inductive branch may include one or more inductors and a resistor.

A first end of the first resistor is connected to a signal input end, a second end of the first resistor is grounded, and the signal input end is configured to provide a signal input (radio frequency input) for the input matching circuit. The first resistor may be a variable resistor or a fixed resistor.

An input end of the inductive branch is connected to the signal input end, an output end of the inductive branch is grounded, and an inductance value of an equivalent inductor of the inductive branch between the signal input end and the ground may vary with adjustment of a frequency of a signal input by the signal input end, so that an LC parallel circuit including the inductive branch and parasitic capacitance of the field-effect transistor may be in a resonant state at the frequency of the input signal.

A gate of the field-effect transistor is connected to the signal input end, a source of the field-effect transistor is grounded, and a drain of the field-effect transistor is for outputting (that is, connected to an output circuit).

Figure 4B:
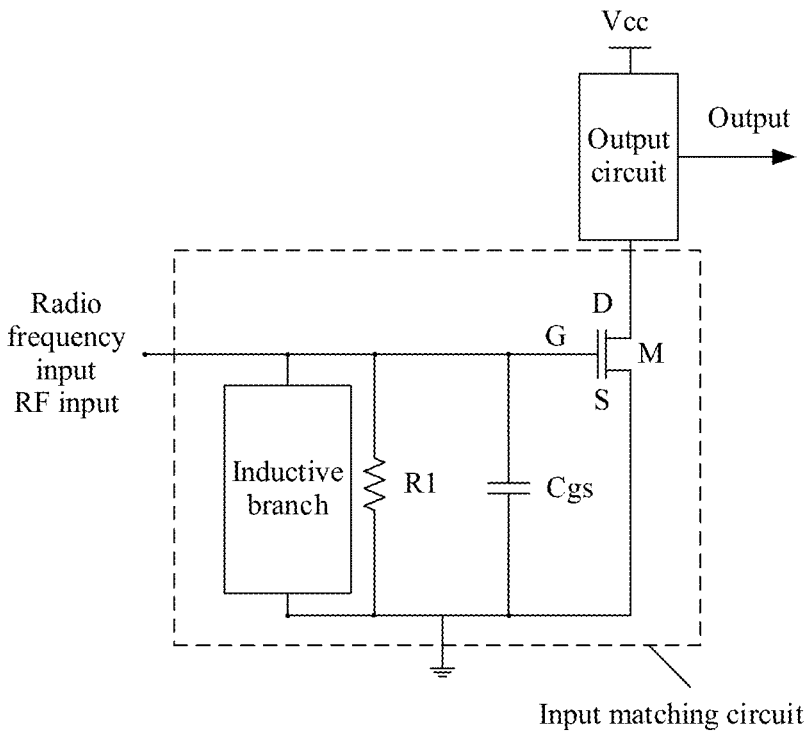
FIG. 4b is a schematic diagram of an equivalent structure of an input matching circuit according to an embodiment of this application.

FIG. 4*b* is a schematic diagram of an equivalent structure of an input matching circuit according to an embodiment of this application. Because the parasitic capacitance Cgs exists in the field-effect transistor in the circuit, the input matching circuit shown in FIG. 4*a* may be equivalent to parallel connection of the inductive branch, the first resistor, and the parasitic capacitance Cgs. The LC parallel circuit may include the inductive branch and the parasitic capacitance Cgs, and the inductance value of the equivalent inductor of the inductive branch between the signal input end and the ground may vary with adjustment of the frequency of the signal input by the signal input end, so that the LC parallel circuit can implement LC resonance at the frequency of the input signal. When the LC parallel circuit is in the resonant state, an impedance value of the LC parallel circuit at the current frequency of the input signal is close to infinity, and then the LC parallel circuit is connected in parallel to the first resistor, so that an impedance value of the input matching circuit can be controlled close to matched impedance. In other words, when the frequency of the input signal changes, the inductance value of the equivalent inductor of the inductive branch between the signal input end and the ground may also change accordingly, so that the impedance value of the input matching circuit is close to the matched impedance. This ensures that internal resistance of the signal is equal to or close to the impedance value of the input matching circuit, to implement input matching at different frequencies, and widen a frequency bandwidth supported by the input matching circuit. It should be noted that a value of the matched impedance is usually equal to internal resistance of a signal source. Common internal resistance of the signal source is usually 50 ohms, 75 ohms, 600 ohms, or another value. In this application, an example in which the internal resistance of the signal source is 50 ohms is used for description, but this should not constitute a limitation on the solutions of this application.

Figure 5A:
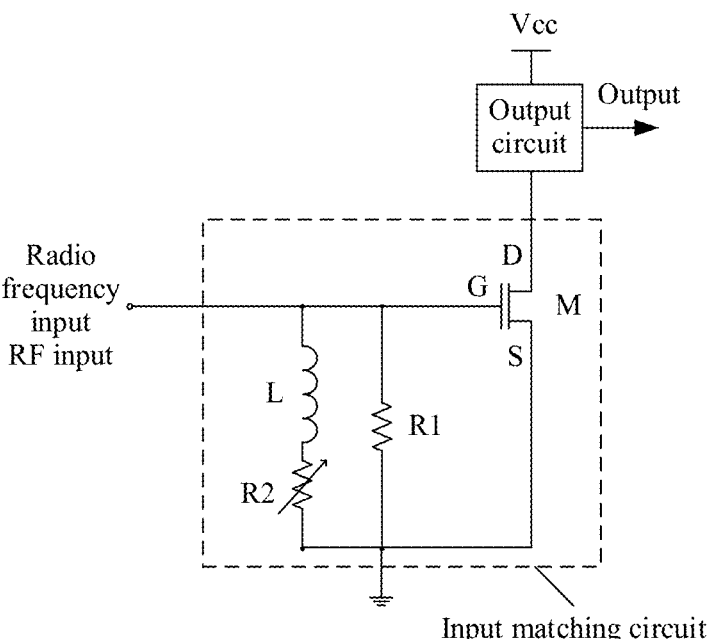
FIG. 5a is a schematic diagram of a structure of another input matching circuit according to an embodiment of this application.

In a possible implementation, the inductive branch in the input matching circuit may include at least one inductor (namely, a first inductor) and one resistor (namely, a second resistor), in other words, the input matching circuit may include the first resistor, the field-effect transistor, the first inductor, and the second resistor. FIG. 5a is a schematic diagram of a structure of another input matching circuit according to an embodiment of this application. The first inductor (for example, L in FIG. 5a) and the second resistor (for example, R2 in FIG. 5a) are connected in series between the signal input end and a ground point, and a series circuit including the first inductor and the second resistor is connected in parallel to the first resistor (for example, R1 in FIG. 5a). The gate of the field-effect transistor is connected to the signal input end, the source and the drain of the field-effect transistor are respectively grounded for outputting, and the second resistor is a variable resistor. When the frequency of the input signal changes, a resistance value of the second resistor is adjusted, to change the inductance value of the equivalent inductor of the inductive branch between the signal input end and the ground, to implement resonance between the inductive branch and Cgs, that is, the LC parallel circuit is in the resonant state at the current frequency of the input signal. It should be noted that, when the first resistor is a fixed resistor and the second resistor is a variable resistor, adjusting the resistance value of the second resistor also affects the impedance value of the input matching circuit. Therefore, when the resistance value of the second resistor is adjusted, whether the inductance value of the equivalent inductor of the inductive branch between the signal input end and the ground can meet a requirement of the resonance state needs to be considered, and whether the impedance value of the input matching circuit is close to the matched impedance also needs to be considered. Optionally, the variable resistor may be a resistor network controlled by a switch array, or a switch transistor array that can be controlled by turning off and on. This is not specifically limited herein.

Figure 5B:
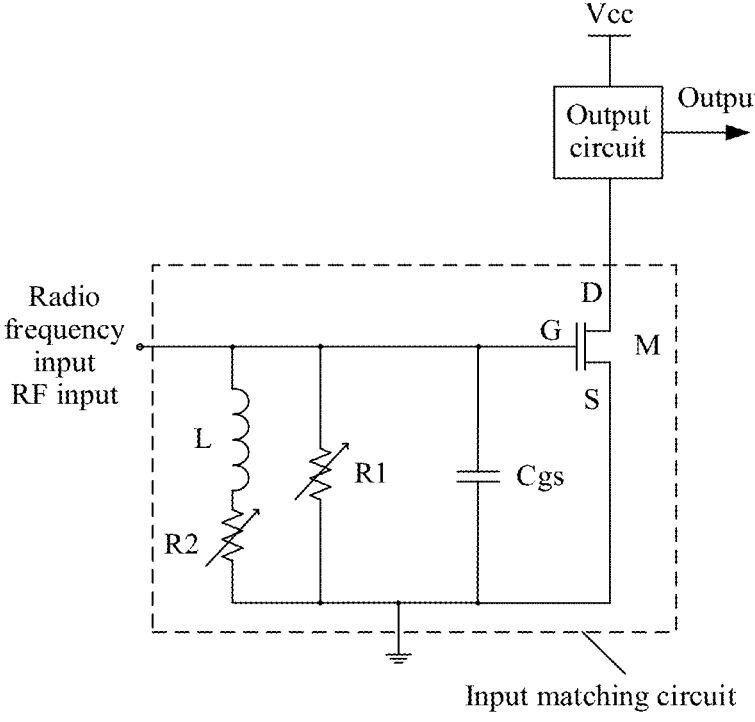
FIG. 5b is a schematic diagram of a structure of another input matching circuit according to an embodiment of this application.
Figure 5C:
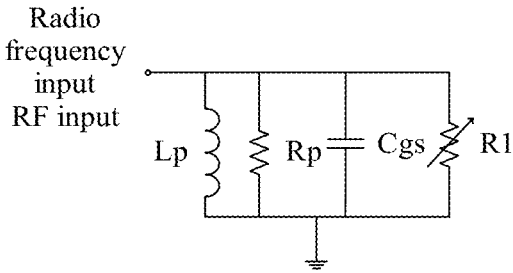
FIG. 5c is a schematic diagram of an equivalent structure of another input matching circuit according to an embodiment of this application.

Optionally, in the structure in which the input matching circuit includes the first resistor, the field-effect transistor, the first inductor, and the second resistor, not only the second resistor is a variable resistor, but the first resistor may also be a variable resistor, so that the resistance value of the second resistor can control the inductance value of the equivalent inductor of the inductive branch between the signal input end and the ground to meet a requirement of the resonance state. In addition, the resistance value of the first resistor controls the impedance value of the input matching circuit to be close to the matched impedance, to avoid a case in which resonance and impedance matching cannot be balanced when only the resistance value of the second resistor can be adjusted. FIG. 5b is a schematic diagram of a structure of another input matching circuit according to an embodiment of this application. The inductive branch is implemented as series connection between the first inductor (for example, L) and the second resistor (for example, R2). Then, the inductive branch is separately connected to the first resistor (for example, R1) and the parasitic capacitance Cgs in parallel, where Cgs is parasitic capacitance of the field-effect transistor, and is not an actual element. For ease of understanding, the following describes an equivalent circuit structure of the input matching circuit shown in FIG. 5b. FIG. 5c is a schematic diagram of an equivalent structure of another input matching circuit according to an embodiment of this application. The inductive branch formed by connecting the first inductor and the second resistor in series in FIG. 5b may be equivalent to parallel connection of an inductor Lp and a resistor Rp in FIG. 5c. Both an inductance value of Lp and a resistance value of Rp are related to the resistance value of the second resistor (R2). Variable inductance may be implemented by adjusting the resistance value of R2, to implement resonance between Lp and Cgs at the current frequency of the input signal, that is, the LC parallel circuit including Lp and Cgs is in the resonant state at the current frequency of the input signal. Then, the resistance value of R1 is adjusted, to ensure that a parallel resistance value of Rp and R1 can be close to the matched impedance, so as to implement impedance matching with an adjustable resonant frequency.

Therefore, the input matching circuit may adjust an LC resonant frequency based on different signal frequencies, to implement impedance matching, so as to achieve an objective that a single input matching circuit covers a wider frequency bandwidth. Therefore, when the front-end drive amplifier uses the foregoing input matching circuit, a resonant frequency of the front-end drive amplifier may be adjusted based on a frequency band of an LNA, and impedance matching is maintained, to implement a function that a single front-end drive amplifier covers a plurality of working frequency bands of the LNA, and reduce a chip area.

In addition, when the signal frequency is high, the input matching circuit may also implement resonance and impedance matching, to resolve matching deterioration at a high frequency. In addition, even if an error exists in a manufacturing process, and consequently an initial impedance value of the input matching circuit is deviated, a resistor in the circuit may be adjusted. Therefore, the impedance value can be close to the matched impedance, and finally, a difference between frequency bandwidths that can be covered by the input matching circuit is not large.

For ease of understanding, the following briefly describes a process of adjusting the inductance value of the inductive branch based on the signal frequency. In the LC parallel circuit, a condition for meeting LC parallel resonance may be:

$$WL - \frac{1}{WC} = 0$$

L is an inductance value, C is capacitance, W=2πf0, and f0 is a resonant frequency.

It is assumed that the frequency of the input signal is f, and f0 is equal to f (that is, the resonant frequency is adjustable). In this case, W also varies with the signal frequency f. When the capacitance C remains unchanged, the inductance value L needs to change accordingly, to ensure that the resonance condition is met. For example, when the signal frequency f changes from a low frequency to a high frequency, the inductance value L needs to be reduced, to ensure that WL−1/WC=0. For example, the inductive branch is series connection between the inductor and the variable resistor R2. For example, when the signal frequency f changes from a low frequency to a high frequency, for example, from 0.6 GHz to 2.7 GHz, the resistance value of R2 may increase, to reduce the inductance value of the inductive branch, and ensure that WL−1/WC=0.

Alternatively, that the LC parallel resonance condition is met may be understood as that in the LC parallel circuit, inductive reactance of the inductor L is equal to capacitive reactance of the capacitor C. Inductive reactance is proportional to a frequency, and capacitive reactance is inversely proportional to a frequency. Therefore, when the frequency of the input signal increases, if the capacitance is fixed, the inductance value needs to be reduced, to reduce the inductive reactance, ensure that the inductive reactance is equal to the capacitive reactance, and implement LC parallel resonance.

It should be noted that impedance matching may be related to real-part impedance and imaginary-part impedance. In the input matching circuit shown in FIG. 5c, a value of the real-part impedance may be determined based on the parallel resistance value of the resistor R1 and the equivalent resistor Rp, and a value of the imaginary-part impedance may be determined based on whether the LC parallel circuit in the circuit is in the resonant state. When the LC parallel circuit is resonant, the imaginary-part impedance of the input matching circuit is 0. In this case, if the real-part impedance of the input matching circuit is equal to the internal resistance (namely, the matched impedance, for example, 50 ohms) of the signal source, impedance matching effect is optimal.

Figure 6:
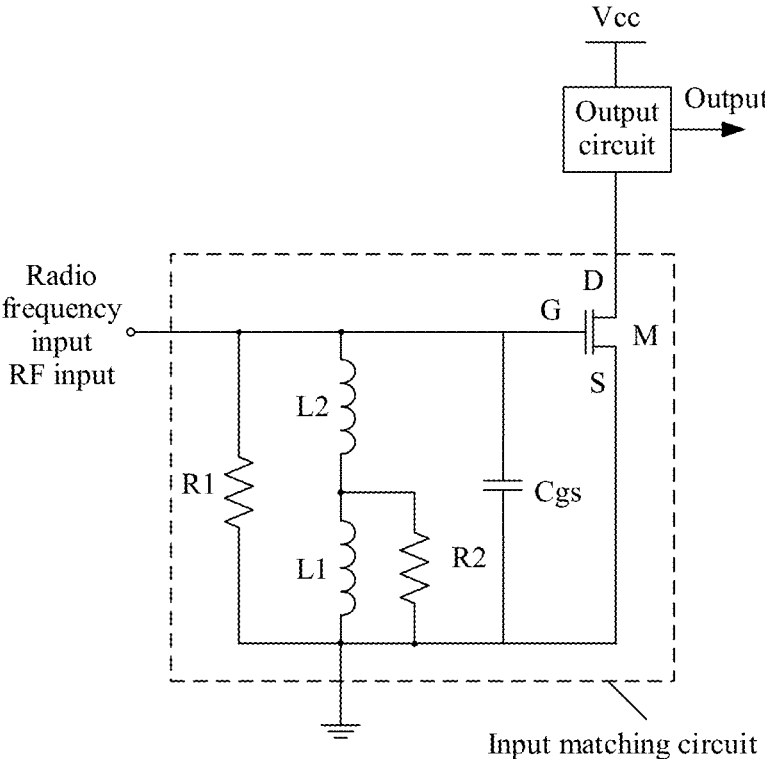
FIG. 6 is a schematic diagram of a structure of another input matching circuit according to an embodiment of this application.

In a possible implementation, the inductive branch may include at least two inductors (namely, a second inductor and a third inductor) and one resistor (namely, a third resistor), that is, the input matching circuit may include the first resistor, the field-effect transistor, the second inductor, the third inductor, and the third resistor. FIG. 6 is a schematic diagram of a structure of another input matching circuit according to an embodiment of this application. The second inductor (for example, L1) and the third inductor (for example, L2) are connected in series between the signal input end and the ground point, the second inductor and the third resistor (for example, R2) are connected in parallel between the third inductor and the ground point, and the inductive branch (namely, a series-parallel network including L1&L2&R2) and the first resistor are connected in parallel. The gate of the field-effect transistor is connected to the signal input end, and the source and the drain of the field-effect transistor are respectively grounded and for outputting. From a perspective of the inductive branch (namely, the series-parallel network including L1&L2&R2), when the frequency of the input signal is low, a signal is usually transmitted in L1 with low impedance instead of the resistor R2. The inductance value of the inductive branch may be simply understood as L1+L2. When the frequency of the input signal is high, a signal is usually transmitted in R2 with low impedance instead of L1 with high impedance (because impedance of an inductor is proportional to a frequency). The inductance value of the inductive branch may be simply understood as L2. Therefore, the series-parallel network including L1&L2&R2 implements an inductor whose inductance decreases as a frequency increases, so that the inductive branch can resonate with the capacitor Cgs at a low frequency and a high frequency. In addition, the LC parallel circuit and the first resistor are connected in parallel, so that the impedance of the input matching circuit can be close to the matched impedance. Therefore, a matching network can meet an impedance matching requirement in a wider frequency bandwidth, that is, the input matching circuit can implement input matching in a wider frequency bandwidth.

It should be noted that the third resistor R2 in the series-parallel network including L1&L2&R2 may be a variable resistor or a fixed resistor. A resistance value of R2 affects a negative slope indicating that the inductance value of the equivalent inductor decreases as the frequency increases, that is, R2 with different resistance values may enable the input matching circuit to implement impedance matching in different frequency bandwidth ranges. When R2 is a fixed resistor, the resistance value of R2 may be determined based on a frequency bandwidth range that needs to be met by the input matching circuit. For example, when the frequency range that needs to be met by the input matching circuit is 1.8 GHz to 2.7 GHz, the resistance value of R2 may be designed as Ra (it is assumed that the resistance value is 20 ohms). When the frequency range that needs to be met by the input matching circuit is 0.6 GHz to 6 GHz, the resistance value of R2 may be designed as Rb (10 ohms), that is, Rb is less than Ra. It may be understood that, if R2 is a variable resistor, the input matching circuit may change, by adjusting the value of R2, the frequency range that needs to be met by the input matching circuit.

Similarly, in the input matching circuit shown in FIG. 6, the first resistor R1 may be a variable resistor or a fixed resistor. Because the input matching circuit may implement LC parallel resonance at a low frequency and a high frequency in a frequency range met by the input matching circuit, R1 connected in parallel to the LC parallel circuit affects the impedance value of the input matching circuit. When the input matching circuit needs to meet different frequency ranges, the resistor R1 may be adjusted, so that final equivalent real-part impedance meets an impedance matching requirement. For example, if R1 is a fixed resistor, when the frequency range that needs to be met by the input matching circuit is 1.8 GHz to 2.7 GHz, the resistance value of R1 may be designed as Rc (it is assumed that the resistance value is 50 ohms). When the frequency range that needs to be met by the input matching circuit is 0.6 GHz to 6 GHz, the resistance value of R1 may be designed as Rd (100 ohms), that is, Rc is less than Rd. It may be understood that, if R1 is a variable resistor, the input matching circuit may ensure, by adjusting the value of R1, that the equivalent real-part impedance meets the impedance matching requirement when the input matching circuit is in different frequency ranges.

Therefore, the input matching circuit may meet LC resonance at a low frequency point and a high frequency point in a specific frequency range, to implement impedance matching, so as to achieve an objective that a single input matching circuit covers a wider frequency bandwidth. In addition, matching deterioration at a high frequency may be resolved.

In conclusion, the input matching circuit provided in this application can implement input matching in a wider frequency bandwidth. In addition, when frequencies of input signals are different, the input matching circuit and the internal resistance of the signal source may also implement impedance matching, to resolve matching deterioration at a high frequency and a large difference between frequency bandwidths that can be covered by the input matching circuit.

It should be noted that the field-effect transistor in the input matching circuit may alternatively be replaced with a triode to achieve the foregoing technical effect. In other words, a solution of replacing the field-effect transistor in the input matching circuit with a triode should also fall within the protection scope of this application.

In addition, this application further provides a front-end drive amplifier. The front-end drive amplifier includes the input matching circuit described in any embodiment.

This application further provides a semiconductor chip. The chip includes the input matching circuit provided in all embodiments of this application.

This application further provides a receiver. The receiver includes the input matching circuit, the front-end drive amplifier, or the semiconductor chip provided in all embodiments of this application. The receiver may further include a low noise amplifier, a frequency mixer, a trans-impedance amplifier, an analog-to-digital converter, or the like.

This application further provides an electronic device. The electronic device includes the input matching circuit, the front-end drive amplifier, or the semiconductor chip provided in all embodiments of this application. The electronic device may further include a communication interface, used by the electronic device to communicate with another device or communication network.

This application provides a chip system. The chip system includes the input matching circuit, the front-end drive amplifier, or the semiconductor chip provided in any embodiment. In a possible design, the chip system further includes a processor and a memory. The memory is configured to store program instructions and data that are necessary for or related to the input matching circuit, the front-end drive amplifier, the semiconductor chip, and the processor. The chip system may include a chip, or may include a chip and another discrete component.

This application provides a system on a SoC. The SoC may include the input matching circuit, the front-end drive amplifier, or the semiconductor chip in any implementation, and a processor, an internal memory, and an external memory that are coupled to the input matching circuit, the front-end drive amplifier, or the semiconductor chip. The SoC may include a chip, or may include a chip and another discrete component.

It should be noted that the connection relationship related in embodiments, for example, serial connection or parallel connection, is electrical connection. The connection may be direct connection by using a wire, or may be coupling in another manner based on electric effect.

In the foregoing embodiments, descriptions of each embodiment have respective focuses. For a part that is not described in detail in an embodiment, refer to related descriptions in other embodiments. The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of embodiments of the present invention.

What is claimed is:

1. An input matching circuit, comprising:
an inductive branch;
a first resistor; and
a field-effect transistor;
wherein the inductive branch comprises one or more inductors and a second resistor;
wherein a first end of the first resistor is connected to a signal input end, a second end of the first resistor is grounded, and the signal input end provides a signal input to the input matching circuit;
wherein an input end of the inductive branch is connected to the signal input end, an output end of the inductive branch is grounded, and an inductance value of the inductive branch between the signal input end and a ground varies with adjustment of a frequency of a signal input by the signal input end, wherein a resistance of the first resistor is adjustable to change an inductance of the inductive branch and cause an inductive capacitive (LC) parallel circuit formed by the inductance of the inductive branch and a parasitic capacitance of the field-effect transistor to reach LC parallel resonance; and
wherein a gate of the field-effect transistor is connected to the signal input end, a source of the field-effect transistor is grounded, and the field-effect transistor comprises a drain.

2. The input matching circuit according to claim 1, wherein the frequency of the signal input by the signal input end is inversely related to the inductance value of the inductive branch between the signal input end and the ground.

3. The input matching circuit according to claim 1, wherein the inductive branch comprises a first inductor and the second resistor, the first inductor and the second resistor are connected in series between the signal input end and a ground point, and the second resistor comprises a variable resistor.

4. The input matching circuit according to claim 3, wherein the first resistor comprises a variable resistor.

5. The input matching circuit according to claim 3, wherein the inductive branch further comprises a second inductor and the second inductor and the second resistor are connected in parallel.

6. The input matching circuit according to claim 5, wherein the first resistor comprises a variable resistor.

7. The input matching circuit according to claim 1, further comprising an output circuit connected to the drain of the field-effect transistor.

8. The input matching circuit according to claim 1, wherein the frequency of the signal input falls within a frequency range that needs to be met by the input matching circuit.

9. The input matching circuit according to claim 1, wherein the inductive branch comprises a plurality of inductors.

10. A receiver, comprising:
one or more low noise amplifiers; and
a front-end drive amplifier coupled to the one or more low noise amplifiers;
wherein the front-end drive amplifier comprises an input matching circuit, the input matching circuit comprises an inductive branch, a first resistor, and a field-effect transistor, wherein the inductive branch comprises one or more inductors and a second resistor;
wherein a first end of the first resistor is connected to a signal input end, a second end of the first resistor is grounded, and the signal input end provides a signal input to the input matching circuit;
wherein an input end of the inductive branch is connected to the signal input end, an output end of the inductive branch is grounded, and an inductance value of the inductive branch between the signal input end and a ground varies with adjustment of a frequency of a signal input by the signal input end;
wherein a gate of the field-effect transistor is connected to the signal input end, a source of the field-effect transistor is grounded, and the field-effect transistor comprises a drain; and
wherein a resistance of at least one of the first resistor or second resistor is adjustable to change an inductance of the inductive branch and cause an inductive capacitive (LC) parallel circuit formed by the inductance of the inductive branch and a parasitic capacitance of the field-effect transistor to reach LC parallel resonance.

11. The receiver according to claim 10, wherein the frequency of the signal input by the signal input end is inversely related to the inductance value of the inductive branch between the signal input end and the ground.

12. The receiver according to claim 10, wherein the inductive branch comprises a first inductor and the second resistor, the first inductor and the second resistor are connected in series between the signal input end and a ground point, and the second resistor comprises a variable resistor.

13. The receiver according to claim 12, wherein the first resistor comprises a variable resistor.

14. The receiver according to claim 12, wherein the inductive branch comprises a second inductor, and the second inductor and the second resistor are connected in parallel.

15. The receiver according to claim 14, wherein the first resistor comprises a variable resistor.

16. The receiver according to claim 10, further comprising an output circuit connected to the drain of the field-effect transistor.

17. The receiver according to claim 10, wherein the receiver comprises a plurality of low noise amplifiers.

18. The receiver according to claim 10, wherein the inductive branch comprises a plurality of inductors.

\*    \*    \*    \*    \*